(12) United States Patent
Nakamura et al.

(10) Patent No.: US 6,563,140 B1
(45) Date of Patent: May 13, 2003

(54) SEMICONDUCTOR LIGHT EMITTING DEVICE AND METHOD FOR PRODUCING THE SAME

(75) Inventors: Shinji Nakamura, Osaka (JP); Masahiro Ishida, Osaka (JP); Masaaki Yuri, Osaka (JP); Osamu Imafuji, Osaka (JP); Kenji Orita, Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/392,376

(22) Filed: Sep. 9, 1999

(30) Foreign Application Priority Data

Sep. 9, 1998 (JP) ............................................. 10-254995

(51) Int. Cl.[7] ............................................. H01L 33/00
(52) U.S. Cl. ............................. 257/94; 257/96; 372/45; 372/46; 372/48; 438/22; 438/46
(58) Field of Search ..................... 257/94, 96; 372/48, 372/45, 46; 438/22, 46, 47, 956

(56) References Cited

U.S. PATENT DOCUMENTS 5,727,008 A  3/1998 Koga ........................... 372/43

FOREIGN PATENT DOCUMENTS

| EP | 0851542 A2 * | 1/1998 |
|---|---|---|
| EP | 0 851 542 | 7/1998 |
| JP | 2-94686 | 4/1990 |
| JP | 9-129974 | 5/1997 |
| JP | 9-246651 | 9/1997 |
| JP | 10-22526 | 1/1998 |
| JP | 10-93192 | 4/1998 |

OTHER PUBLICATIONS

European Search Report dated Feb. 24, 2000 for EP 99 11 7438.

S. Nakamura et al., "MOCVD Growth of GaN on Grooved AlGaN/GaN Layers for Inner Stripe Lasers", 2nd Intern. Symp. on Blue Laser and Light Emitting Diodes, Chiba, Japan, pp. 162–165, Sep. 29—Oct. 2, 1998.

Shin–ya Nunoue et al., "Reactive Ion Beam Etching and Overgrowth Process in the Fabrication of InGaN Inner Stripe Laser Diodes", Japanese Journal of Applied Physics, vol. 37, 1998, pp. 1470–1473.

* cited by examiner

Primary Examiner—Tom Thomas
(74) Attorney, Agent, or Firm—RatnerPrestia

(57) ABSTRACT

A semiconductor light emitting device of the present invention includes: a substrate; a light emitting layer; a semiconductor layer of a hexagonal first III-group nitride crystal; and a cladding layer of a second III-group nitride crystal. A stripe groove is provided in the semiconductor layer along a <1, 1, –2, 0> direction.

8 Claims, 2 Drawing Sheets

PRIOR ART

SEMICONDUCTOR LIGHT EMITTING DEVICE AND METHOD FOR PRODUCING THE SAME

BACKGROUND OF THE INVENTION

1. Field of the Invention

The present invention relates to a semiconductor laser device having a nitride semiconductor crystal.

2. Description of the Related Art

A semiconductor laser device having a nitride semiconductor crystal is a laser device which oscillates within a wavelength band around a blue wavelength. It has been confirmed that such a laser device has a laser oscillation function.

Many semiconductor laser devices which have been confirmed to provide laser oscillation have a gain guiding structure or a simple ridge structure with no buried structure. For these semiconductor laser devices, there is a demand to improve the driving efficiency and to provide a waveguide which allows for a stable single transverse mode.

In the conventional ridge type semiconductor device, a GaN-type material is typically cleaved along the {1, −1, 0, 0} facet thereof to provide a cavity surface. This is because the {1, −1, 0, 0} facet of a GaN-type material provides a desirable cleaved surface.

A semiconductor laser device having a buried structure is known in the art as a type of semiconductor laser device which has both a desirable current constricting function and an optical waveguide characteristic with a low propagation loss.

A conventional semiconductor laser device having a buried structure will be described below with reference to FIG. 3. Referring to FIG. 3, a buffer layer 2 of i-GaN and an n-side contact layer 3 of n-GaN are provided in this order on a substrate 1. An n-side cladding layer 4 of n-$Al_{0.1}Ga_{0.9}N$ is provided on a portion of the n-side contact layer 3. A light emitting layer 5 having a multilayer structure, a first p-side cladding layer 6 of p-$Al_{0.1}Ga_{0.9}N$, and an n-type current blocking layer 7 of n-$Al_{0.2}Ga_{0.8}N$ are provided in this order on the n-side cladding layer 4. The n-type current blocking layer 7 includes a stripe groove 7a which reaches the first p-side cladding layer 6. The stripe groove 7a is provided to localize the electric current passing therethrough to a narrow area. A second p-side cladding layer 8 of p-$A_{0.1}Ga_{0.9}N$ is provided on the n-type current blocking layer 7 so as to fill up the groove 7a. A p-side contact layer 9 of p-GaN and a p-side electrode 10 are provided in this order on the second p-side cladding layer 8.

An n-side electrode 11 is provided on the other portion of the n-side contact layer 3.

If such a buried type semiconductor device has its cleaved surface along the {1, −1, 0, 0} facet, as in the ridge type semiconductor device, the stripe groove is formed along the <1, −1, 0, 0> direction of the n-type current blocking layer 7.

FIG. 4 is a diagram illustrating a portion of an intermediate structure of the conventional semiconductor laser device during the crystal growth of the second p-side cladding layer 8. As illustrated in FIG. 4, the second p-side cladding layer 8 being grown contains a large number of disturbed surfaces along the stripe groove 7a.

In such a conventional semiconductor laser device, the crystal quality of the second p-side cladding layer 8 is quite poor along or near the stripe groove 7a. Such a semiconductor laser device has a substantial propagation loss. However, the poor crystal quality has not been addressed as a problem, or it has been neglected. The present inventors have found that each of the disturbed surfaces formed along the stripe groove 7a extends along the {1, −1, 0, 1} facet and at a certain angle with respect to the <1, −1, 0, 0> direction of the stripe groove.

SUMMARY OF THE INVENTION

According to one aspect of this invention, a semiconductor light emitting device includes: a substrate; a light emitting layer; a semiconductor layer of a hexagonal first III-group nitride crystal; and a cladding layer of a second III-group nitride crystal. A stripe groove is provided in the semiconductor layer along a <1, 1, −2, 0> direction.

Thus, the stripe groove is oriented along the <1, 1, −2, 0> direction, so that the crystal growth surface {1, −1, 0, 1} and the stripe groove are parallel to each other. As a result, a crystal grows along a surface which is substantially parallel to the side surface of the <1, 1, −2, 0> stripe groove. Thus, it is possible to prevent disturbed surfaces from being produced in the cladding layer, thereby improving the crystal quality in the vicinity of the groove.

In one embodiment of the invention, a slope of the stripe groove extends at an angle of about 20° to about 80° with respect to a primary surface of the substrate.

With such a structure, as the angle between the slope of the groove and the primary surface of the substrate is about 20° or more, it is possible to reduce the area of the semiconductor layer existing below the slope where the thickness of the semiconductor layer is small, and to suppress the current flowing through the semiconductor layer. Moreover, as the angle between the slope of the groove and the primary surface of the substrate is about 80° or less, it is possible to suppress the shift or variation in the composition of the III-group nitride material in the semiconductor layer or in the cladding layer.

In one embodiment of the invention, an electric resistivity of the semiconductor layer is larger than that of the cladding layer.

With such a structure, the resistance of the semiconductor layer can be increased, so that the semiconductor layer may function as a current blocking layer.

In one embodiment of the invention, a conductivity type of the semiconductor layer is opposite to that of the cladding layer.

With such a structure, as the conductivity type of the semiconductor layer is opposite to that of the cladding layer, the semiconductor layer may function as a current blocking layer.

In one embodiment of the invention, a refractive index of the semiconductor layer is smaller than that of the cladding layer.

With such a structure, it is possible to obtain a semiconductor light emitting device which realizes a single transverse mode current constricting function.

In one embodiment of the invention, the semiconductor layer includes $Al_xGa_{1-x}N$ ($0 \leq x \leq 1$), and the cladding layer includes $Al_yGa_{1-y}N$ ($0 \leq y \leq 1$ and y<x).

With such a structure, as the refractive index of the semiconductor layer is smaller than that of the cladding layer, it is possible to obtain a semiconductor light emitting device which realizes a single transverse mode current constricting function.

In one embodiment of the invention, the cladding layer includes a groove which extends along a (1, −1, 0, 1) facet.

With such a structure, it is possible to maintain a desirable crystal growth surface of the cladding layer, thereby improving the crystallinity of the cladding layer.

In one embodiment of the invention, the stripe groove is formed by an isotropic dry etching process.

With such a structure, it is possible to obtain a semiconductor layer having a desirable crystal growth surface, thereby improving the crystallinity of the cladding layer.

According to another aspect of this invention, a method for producing a semiconductor light emitting device is provided. The method includes the steps of: providing a light emitting layer; providing a semiconductor layer of hexagonal first III-group nitride crystal; providing a stripe groove in the semiconductor layer along a <1, 1, −2, 0> direction by an isotropic dry etching process: and providing a cladding layer of a second III-group nitride crystal on the semiconductor layer after the step of providing the stripe groove.

With such a structure, as the stripe groove is provided in the semiconductor layer along the <1, 1, −2, 0> direction by an isotropic dry etching process, the slope of the groove in the semiconductor layer can be a desirable crystal growth surface.

In one embodiment of the invention, in the step of providing the stripe groove, a slope of the stripe groove extends at an angle of about 20° to about 80° with respect to a primary surface of a substrate.

With such a structure, as the angle between the slope and the primary surface of the substrate is about 20° or more, it is possible to reduce the area of the semiconductor layer where the thickness thereof is small, and the semiconductor layer can be a current blocking layer which allows less current to pass therethrough. Moreover, as the angle between the slope of the groove and the primary surface of the substrate is about 80° or less, it is possible to suppress the shift or variation in the composition of the III-group nitride material in the vicinity of the slope, which may occur during a crystal growth process.

In one embodiment of the invention, the cladding layer is provided by a crystal growth method such that a crystal growth rate is greater on the stripe groove than on a surface other than the stripe groove.

With such a structure, the slope of the semiconductor layer can be an even more desirable crystal growth surface.

In one embodiment of the invention, the isotropic dry etching process used in the step of providing the stripe groove is a reactive ion etching process with a mixed gas containing boron chloride and nitrogen.

With such a structure, the slope of the semiconductor layer can be an even more desirable crystal growth surface.

In one embodiment of the invention, the step of providing the stripe groove includes the steps of: providing a mask having a stripe opening along a <1, 1, −2, 0> direction on the semiconductor layer; providing a stripe groove in the semiconductor layer by using the isotropic dry etching process after providing the mask; and removing the mask after the step of providing the stripe groove.

With such a structure, as the mask having the stripe opening along the <1, 1, −2, 0> direction is provided on the semiconductor layer, and the groove is provided in the semiconductor layer by using the isotropic dry etching process, it is possible to provide the groove having a desirable crystal growth surface in the semiconductor layer.

In one embodiment of the invention, a resist mask is used as the mask.

With such a structure, the angle between the crystal growth surface and the primary surface of the substrate can be controlled so as to provide a groove having a desirable crystal growth surface in the semiconductor layer.

Thus, the invention described herein makes possible the advantages of: (1) providing a semiconductor laser device with a reduced propagation loss; and (2) providing a method for producing such a semiconductor laser device.

These and other advantages of the present invention will become apparent to those skilled in the art upon reading and understanding the following detailed description with reference to the accompanying figures.

DESCRIPTION OF THE PREFERRED EMBODIMENTS

Figure 1:
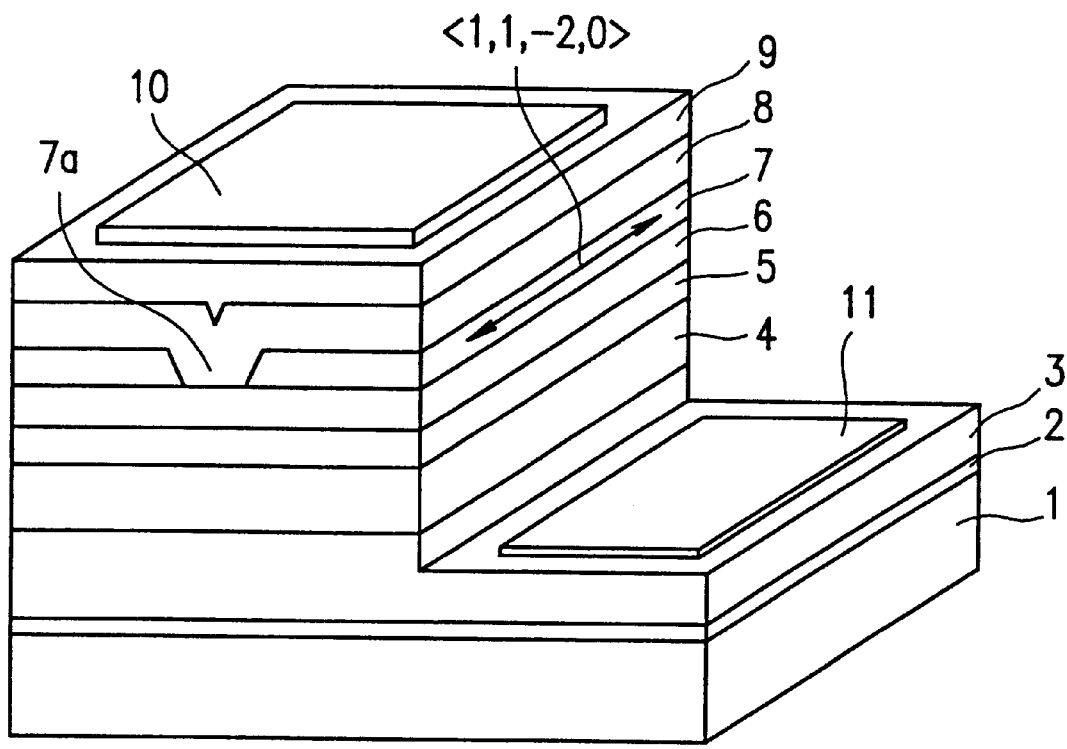
FIG. 1 is a diagram illustrating a semiconductor laser device according to an embodiment of the present invention.

An embodiment of the present invention will now be described with reference to FIG. 1. Referring to FIG. 1, a buffer layer 2 of i-GaN having a thickness of about 0.3 $\mu$m, and an n-side contact layer 3 of n-GaN having a thickness of about 2 $\mu$m are provided in this order on a substrate 1 of GaN. An n-side cladding layer 4 of Si-doped $Al_{0.1}Ga_{0.9}N$ having a thickness of about 1 $\mu$m is provided on a portion of the n-side contact layer 3.

A light emitting layer 5 having a multilayer structure, a first p-side cladding layer 6 of Mg-doped $p-Al_{0.1}Ga_{0.9}N$ having a thickness of about 0.1 $\mu$m, and an n-type current blocking layer 7 of Si-doped $n-Al_{0.2}Ga_{0.8}N$ having a thickness of about 0.4 $\mu$m are provided in this order on the n-side cladding layer 4.

The n-type current blocking layer 7 includes a stripe groove 7a which has an opening width of about 1.5 $\mu$m and reaches the first p-side cladding layer 6. The stripe groove 7a is provided to localize the electric current passing therethrough to a narrow area. The stripe groove 7a is provided to extend along the <1, 1, −2, 0> direction of the n-type current blocking layer 7. Each side surface of the stripe groove 7a extends at an angle of about 135° with respect to the bottom surface of the stripe groove 7a.

A second p-side cladding layer 8 of Mg-doped $p-Al_{0.1}Ga_{0.9}N$ (a nitride semiconductor layer) is provided on the n-type current blocking layer 7 so as to fill up the groove 7a. The thickness of the second p-side cladding layer 8 (outside the groove 7a area) is about 1 $\mu$m.

A p-side contact layer 9 of Mg-doped p-GaN having a thickness of about 1 $\mu$m and a p-side electrode 10 are provided in this order on the second p-side cladding layer 8.

An n-side electrode 11 is provided on the other portion of the n-side contact layer 3.

The stripe groove 7a is formed by an isotropic dry etching process as follows. First, a mask having a stripe opening along the <1, 1, −2, 0> direction is provided on the n-type current blocking layer 7, which has been grown by a crystal growth process. Then, the stripe groove 7a is provided in the n-type current blocking layer 7 by using a reactive ion etching process with a mixed gas containing, for example, boron chloride and nitrogen. The etching process is performed with a flow rate of the boron chloride and nitrogen of about 10 sccm and under a pressure of about 50 mTorr. A resist mask may be used as the mask. By using a resist mask, the angle of each slope of the stripe groove 7a can be controlled so that the slope of the stripe groove 7a is a desirable crystal growth surface.

Figure 2:
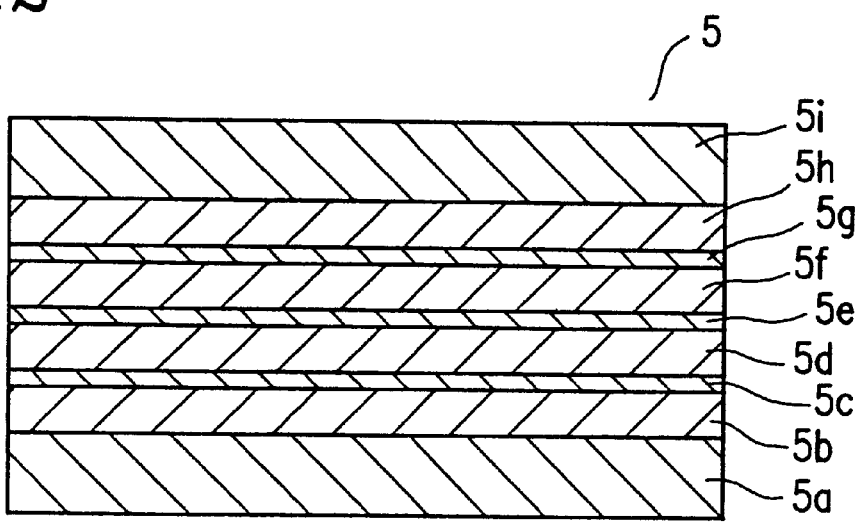
FIG. 2 is a diagram illustrating a cross section of a light emitting layer of the semiconductor laser device.
Figure 3:
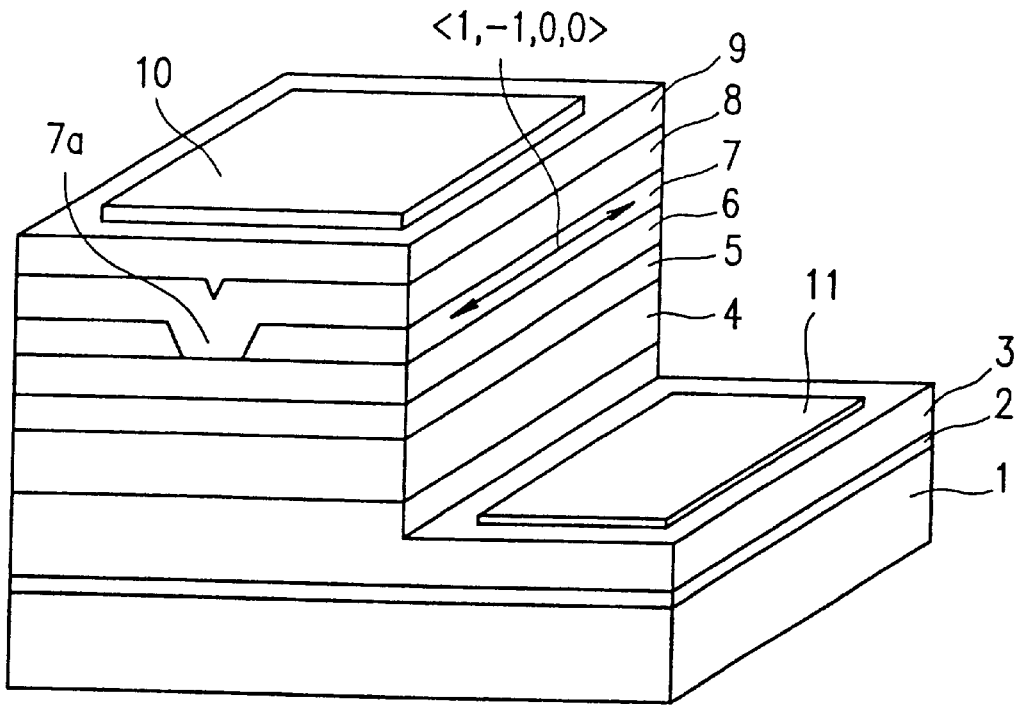
FIG. 3 is a diagram illustrating a conventional semiconductor laser device.
Figure 4:
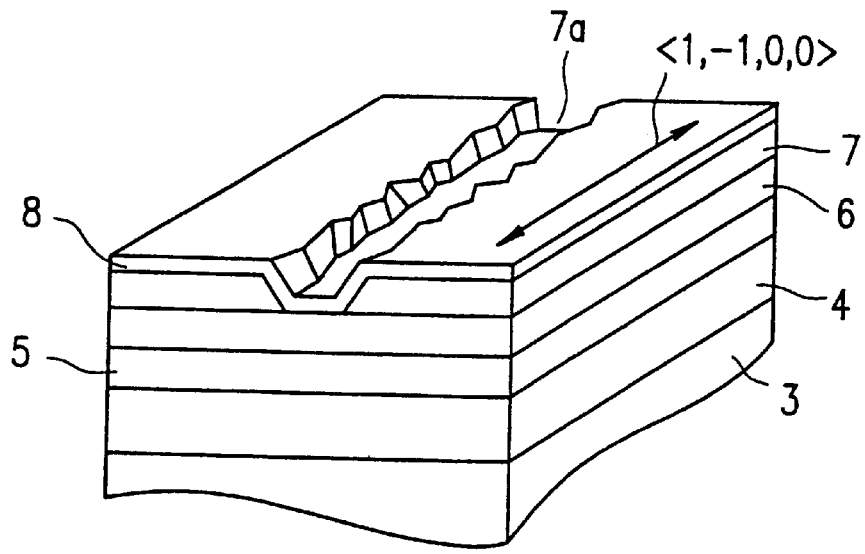
FIG. 4 is a diagram illustrating an intermediate structure of the conventional semiconductor laser device.

FIG. 2 is a diagram illustrating a cross section of the light emitting layer 5. Referring to FIG. 2, the light emitting layer 5 includes: an n-side optical waveguide layer 5a of Si-doped n-$Al_{0.1}Ga_{0.9}N$ having a thickness of about 400 Å; a barrier layer 5b of i-InGaN having a thickness of about 200 Å; a quantum well layer 5c of i-InGaN having a thickness of about 30 Å; a barrier layer 5d of i-InGaN having a thickness of about 70 Å; a quantum well layer 5e of i-InGaN having a thickness of about 30 Å; a barrier layer 5f of i-InGaN having a thickness of about 70 Å; a quantum well layer 5g of i-InGaN having a thickness of about 30 Å; a barrier layer 5h of i-InGaN having a thickness of about 200 Å; and ap-side optical waveguide layer 5i of i-$Al_{0.1}Ga_{0.9}N$ having a thickness of about 400 Å. These layers 5a to 5i are deposited in this order to provide the light emitting layer 5.

Although the barrier layers 5b and 5h are both an i-type semiconductor as they are deposited, an impurity may be introduced into the layers through a subsequent heat treatment, or the like.

In the semiconductor laser device according to the present embodiment of the invention, the stripe groove 7a is formed along the <1, 1, −2, 0> direction of the n-type current blocking layer 7. In this way, the angle between each side surface of the stripe groove 7a and the crystal growth surface (1, −1, 0, 1) is reduced, whereby the second p-side cladding layer 8 is formed therein to be a smooth layer.

The present invention can similarly be carried out when the light emitting layer 5 is provided in the stripe groove 7a. Moreover, a ridge-shaped structure may be buried in the groove 7a.

The light emitting layer 5 may be either a p-type or n-type semiconductor. Moreover, the n-type current blocking layer 7 may include an i-type nitride crystal or a high-resistance nitride semiconductor.

The angle between each slope of the stripe groove 7a and the (0, 0, 0, 1) facet may be about 20° to about 80°. In this way, it is possible to reduce the area of the portion of the semiconductor layer where the thickness thereof is small, whereby the semiconductor layer can be a current blocking layer which allows less current to pass there-through. Moreover, as the angle between the slope and the (0, 0, 0, 1) facet is about 20° to about 80°, it is possible to suppress the shift or variation of the Al content in the second p-side cladding layer 8 in the vicinity of the slope, which may occur during a crystal growth process.

A groove including the (1, −1, 0, 1) facet may be provided in the second p-side cladding layer 8.

The second p-side cladding layer 8 may be provided by a crystal growth method such that the crystal growth rate is greater on the slope of the stripe groove 7a than on another surface.

A semiconductor laser having a groove structure has been described above. However, the present invention is not limited to such a groove structure. For example, the present invention may alternatively be applied to a semiconductor laser having a ridge or mesa stripe structure (e.g., the second p-type cladding layer is provided in the form of a ridge or a mesa where each side surface thereof is a crystal growth surface).

As described above, in the semiconductor laser device of the present invention, it is possible to prevent disturbed surfaces from being produced in the second cladding layer so as to provide a uniform crystal in the vicinity of the groove, thereby improving the crystal quality. Thus, it is possible to reduce the propagation loss of the semiconductor laser device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:
   a substrate;
   a light emitting layer;
   a semiconductor layer of a hexagonal first III-group nitride crystal; and
   a cladding layer of a second III-group nitride crystal grown on the semiconductor layer, wherein:
   a stripe groove is provided in the semiconductor layer along a <1, 1, −2, 0> direction; and
   a slope of the stripe groove extends at an angle of less than about 80° with respect to a primary surface of the substrate so as to suppress a shift or variation in the composition of the III-group nitride material of the semiconductor layer.

2. A semiconductor light emitting device according to claim 1, wherein the slope of the stripe groove extends at an angle from about 20° to less than about 80° with respect to the primary surface of the substrate so as to suppress current from flowing through the semiconductor layer.

3. A semiconductor light emitting device according to claim 1, wherein an electric resistivity of the semiconductor layer is larger than that of the cladding layer.

4. A semiconductor light emitting device according to claim 1, wherein a conductivity type of the semiconductor layer is opposite to that of the cladding layer.

5. A semiconductor light emitting device according to claim 1, wherein a refractive index of the semiconductor layer is smaller than that of the cladding layer.

6. A semiconductor light emitting device according to claim 1, wherein:
   the semiconductor layer comprises $Al_xGa_{1-x}N$ ($0 \leq x \leq 1$); and
   the cladding layer comprises $Al_yGa_{1-y}N$ ($0 \leq y \leq 1$ and $y<x$).

7. A semiconductor light emitting device according to claim 1, wherein the cladding layer comprises a groove which extends along a (1, −1, 0, 1) facet.

8. A semiconductor light emitting device according to claim 1, wherein the stripe groove is formed by an isotropic dry etching process.

* * * * *